(12) United States Patent
Yamasaki

(10) Patent No.: US 8,124,431 B2
(45) Date of Patent: Feb. 28, 2012

(54) NITRIDE SEMICONDUCTOR LASER DEVICE AND METHOD OF PRODUCING THE SAME

(75) Inventor: Yukio Yamasaki, Daito (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/805,750

(22) Filed: Aug. 18, 2010

(65) Prior Publication Data

US 2010/0317134 A1    Dec. 16, 2010

Related U.S. Application Data

(62) Division of application No. 11/715,443, filed on Mar. 8, 2007, now Pat. No. 7,804,878.

(30) Foreign Application Priority Data

Mar. 14, 2006  (JP) .................................. 2006-069350

(51) Int. Cl.
*H01L 21/00* (2006.01)
(52) U.S. Cl. ............. 438/31; 438/22; 438/46; 438/479; 438/698; 257/E21.211; 257/103; 257/87; 257/98
(58) Field of Classification Search .................... 438/22, 438/31, 46, 479, 698; 257/E21.211, 103, 257/87, 98
See application file for complete search history.

(56) References Cited

U.S. PATENT DOCUMENTS

| | | | |
|---|---|---|---|
| 6,653,663 B2* | 11/2003 | Ishida | 257/103 |
| 6,850,547 B2 | 2/2005 | Goto | |
| 7,123,640 B2 | 10/2006 | Hanaoka | |
| 7,257,140 B2* | 8/2007 | Yoneda | 372/46.01 |
| 2002/0001327 A1 | 1/2002 | Goto | |
| 2004/0002233 A1* | 1/2004 | Advocate et al. | 439/66 |
| 2004/0013149 A1 | 1/2004 | Hanaoka | |

(Continued)

FOREIGN PATENT DOCUMENTS

JP     55-87452     7/1980

(Continued)

OTHER PUBLICATIONS

Japanese Office Action dated Jan. 5, 2010 corresponding to Japanese Application No. 069350/2006 and english translation thereof.

(Continued)

*Primary Examiner* — Jack Chiang
*Assistant Examiner* — Wilner Jean Baptiste
(74) *Attorney, Agent, or Firm* — Harness, Dickey & Pierce, P.L.C.

(57) ABSTRACT

A method of producing a nitride semiconductor laser device includes: forming a wafer including a nitride semiconductor layer of a first conductivity type, an active layer of a nitride semiconductor, a nitride semiconductor layer of a second conductivity type, and an electrode pad for the second conductivity type stacked in this order on a main surface of a conductive substrate and also including stripe-like waveguide structures parallel to the active layer; cutting the wafer to obtain a first type and a second type of laser device chips; and distinguishing between the first type and the second type of chips by automatic image recognition. The first type and the second type of chips are different from each other in position of the stripe-like waveguide structure with respect to a width direction of each chip and also in area ratio of the electrode pad to the main surface of the substrate.

14 Claims, 11 Drawing Sheets

U.S. PATENT DOCUMENTS

| | | |
|---|---|---|
| 2004/0071176 A1 | 4/2004 | Ohta et al. |
| 2007/0195851 A1 | 8/2007 | Chae et al. |
| 2008/0083996 A1 * | 4/2008 | Kudo ............................ 257/797 |

FOREIGN PATENT DOCUMENTS

| | | |
|---|---|---|
| JP | 60-18928 | 1/1985 |
| JP | 63-173381 | 7/1988 |
| JP | 3-16111 | 1/1991 |
| JP | 3-225888 | 10/1991 |
| JP | 06-079172 | 11/1994 |
| JP | 8-327859 | 12/1996 |
| JP | 10-242581 | 9/1998 |
| JP | 2002-016313 | 1/2002 |
| JP | 2003-243765 | 8/2003 |
| JP | 2004-055683 | 2/2004 |
| JP | 2004-95859 | 3/2004 |
| JP | 2004-356454 | 12/2004 |

OTHER PUBLICATIONS

Notice of Allowance dated Dec. 21, 2010 in corresponding Japanese Patent Application No. 2006-069350 and English translation thereof.
US Office Action dated Apr. 15, 2011 issued in co-pending U.S. Appl. No. 12/801,831.

* cited by examiner

NITRIDE SEMICONDUCTOR LASER DEVICE AND METHOD OF PRODUCING THE SAME

PRIORITY STATEMENT

This application is a divisional under 35 U.S.C. §121 of U.S. application Ser. No. 11/715,443, filed Mar. 8, 2007, now U.S. Pat. No. 7,804,878 which claims priority under 35 U.S.C. §119 to Japanese Application No. 2006-069350, filed Mar. 14, 2006, the entire contents of each of which are hereby incorporated by reference.

BACKGROUND

1. Technical Field

The present invention relates to improvement in a nitride semiconductor laser device and a method of producing the same.

2. Description of the Related Art

From the past, prototypes of nitride semiconductor laser devices for emitting light in a wavelength range from blue to ultraviolet have been fabricated using nitride-based semiconductor materials such as GaN, InN, AlN, and a mixed crystal semiconductor thereof.

FIG. 9 is a schematic cross-sectional view exemplarily showing a main part of a conventional nitride semiconductor laser device for lasing at a wavelength of 405 nm. This semiconductor laser device includes an n-type GaN layer (thickness: 3 μm) 902; an n-type $In_{0.05}Ga_{0.95}N$ buffer layer 903; an n-type $Al_{0.05}Ga_{0.95}N$ clad layer (thickness: 2.0 μm) 904; an n-type GaN optical waveguide layer (thickness: 0.1 μm) 905; an $In_{0.2}Ga_{0.8}N$/n-type $In_{0.05}Ga_{0.95}N$ (respective thicknesses: 4 nm/8 nm) triple-quantum-well (3MQW) active layer 906; a p-type $Al_{0.2}Ga_{0.8}N$ carrier stop layer (thickness: 20 nm) 907; a p-type GaN optical waveguide layer (thickness: 0.1 μm) 908; a p-type $Al_{0.05}Ga_{0.95}N$ clad layer (thickness: 0.5 μm) 909; and a p-type GaN contact layer (thickness: 0.2 μm) 910 stacked in this order on an n-type GaN substrate 901.

A ridge-like stripe 902 of 2 μm width is formed by partially etching p-type GaN contact layer 910 through to a partial depth of p-type AlGaN clad layer 909. Accordingly, the laser device of FIG. 9 has an optical confinement waveguide structure in which active layer 906 and optical waveguide layers 905 and 908 are sandwiched between clad layers 904 and 909, and then light generated in active layer 906 is confined in this waveguide structure and causes lasing action. It should be noted that FIG. 9 does not show the entire width of the laser device chip but only a part thereof in the vicinity of the ridge-like stripe.

A p-side contact electrode 911 is formed on p-type GaN contact layer 910 left after the partial etching, and insulating films 913 are formed on the partially etched areas. A p-side electrode pad 914 is formed in contact with p-side contact electrode 911. On the other hand, an n-side electrode 915 is formed on a rear surface of substrate 901.

The laser device of FIG. 9 is obtained by dividing a wafer including a large number of laser device structures into chips. To facilitate the chip division, therefore, substrate 901 is polished to have a thickness of 50 to 200 μm before n-side electrode 915 is formed thereon. Then, the nitride semiconductor laser device of FIG. 9 with a width of 300 to 400 μm is obtained by dividing the wafer into chips.

FIG. 10 is a schematic plan view of the nitride semiconductor laser device of FIG. 9 seen from above. Ridge-like stripe 912 is formed on the upper surface of the nitride semiconductor laser device, and the p-side contact electrode (not shown) is formed over the entire upper surface of the ridge-like stripe. Further, p-side electrode pad 914 is formed to cover almost the entire upper surface of the nitride semiconductor laser device.

The nitride semiconductor laser device of FIG. 10 is mounted on a stem, and thereafter wire bonding is performed in an area not including ridge-like stripe 912 on p-side electrode pad 914. Therefore, p-side electrode pad 914 is generally formed such that a circular region of more than 80 μm diameter is securely obtained for a wire bonding area.

Generally, in order to reduce the cost for a nitride semiconductor laser device, it is desirable to increase the yield rate of the laser devices obtained from one wafer by reducing the width of the laser device to 50 to 250 μm. However, when a nitride semiconductor laser device has a reduced width, problems arise in a laser device fabricated by a technique described below.

In Japanese Patent Laying-Open No. 2004-356454, trenched regions each having a stripe-like groove are formed at an interval of several hundred micrometers on a nitride semiconductor substrate in order to suppress occurrence of cracks during crystal growth of nitride semiconductor layers. Accordingly, a hill portion is naturally formed between adjacent trenched regions. By growing nitride semiconductor layers and form a layered structure thereof on a substrate subjected to such working as above (hereinafter referred to as a worked substrate), occurrence of cracks in the layered structure can be prevented, and surface flatness of the layered structure over the hill portion can be improved to some extent.

When the nitride semiconductor layers are grown to form the layered structure on the worked substrate, however, a swelling with a height of several micrometers is caused adjacent to a trenched region in an upper surface of the layered structure. Taking account of the photolithographic process in fabricating a nitride semiconductor laser device, therefore, the ridge-like stripe structure should be formed more than 90 μm away and preferably more than 110 μm away from the trenched region.

FIG. 11 is a schematic plan view showing an example of an upper surface of a bar obtained after formation of resonator end faces of each nitride semiconductor laser device (i.e., after a wafer including a large number of laser device structures is divided into bars) and just before the bar (hereinafter referred to as a laser bar) is divided into individual chips. In FIG. 11, trenched regions 1101 are formed at an interval of 800 μm for example, and then ridge-like stripes 1102 and p-side electrode pads 1103 are formed between trenched regions 1101. Every dotted line in FIG. 11 indicates a chip division plane, and the chip width is set to 200 μm for example.

As described above, in FIG. 11, a distance (L) between ridge-like stripe 1102 and trenched region 1101 should desirably be set to more than 110 μm. In order to set the chip width to 200 μm, therefore, ridge-like stripe 1102 in each of certain particular chips is set at a position different from that in the other chips, with respect to the width direction of the chip. More specifically, in FIG. 11, the position of ridge-like stripe 1102 in a laser device chip (B) is different from that in a laser device chip (A), with respect to the width direction of the chip.

The laser bar in such a state as above may cause problems as described below during the subsequent process of producing laser devices.

Firstly, after the laser bar is divided into individual laser device chips, it is necessary to inspect all the chips. In the case of using an automatic chip inspection apparatus, if the apparatus is set to determine the position of the ridge-like stripe in chip (A) as normal, then there is a problem that it determines all of chips (B) as defective.

Further, when a chip is mounted on a stem, the light-emitting point in the chip should be made coincident with the center of the stem. However, since the light-emitting point in chip (B) is different from that in chip (A) with respect to the width direction, it is necessary to mount chip (B) at a chip position changed relatively on the stem.

SUMMARY

The present invention has been made to solve the aforementioned problems, and makes it possible that, when nitride semiconductor laser devices of a small width are handled in an automatic chip inspection apparatus or an automatic mounting apparatus, only some particular chips can be selected readily and automatically by image recognition.

In the specification of the present application, the automatic image recognition includes processes of measuring a size of an area having a light intensity of more than a preset threshold value in a light intensity distribution obtained by imaging a chip from above with a camera, comparing the measured size with a preset size, and determining whether it falls within a preset tolerance.

A method of producing a nitride semiconductor laser device according to the present invention includes the steps of: forming a wafer including a nitride semiconductor layer of a first conductivity type, an active layer of a nitride semiconductor, a nitride semiconductor layer of a second conductivity type, and an electrode pad for the second conductivity type stacked in this order on a main surface of a conductive substrate and also including a plurality of stripe-like waveguide structures parallel to the active layer; cutting the wafer to obtain a first type of nitride semiconductor laser device chip and a second type of nitride semiconductor laser device chip; and distinguishing between the first type and the second type of laser device chips by automatic image recognition, wherein the first type and the second type of laser device chips are different from each other in position of the stripe-like waveguide structure with respect to a width direction of each chip and also in area ratio of the electrode pad for the second conductivity type to the main surface of the substrate.

It is desirable that the area ratio of the electrode pad for the second conductivity type in the first type of laser device chip is less than 90% of that of the electrode pad for the second conductivity type in the second type of laser device chip. In each of the first type and the second type of laser device chips, a metal layer of less than 0.1 µm thickness may be formed in an area not having the electrode pad for the second conductivity type on an upper surface of the semiconductor layer of the second conductivity type, or the metal layer may be omitted.

It is desirable that, in each of the first type and the second type of laser device chips, the electrode pad for the second conductivity type includes a circular area of 80 µm diameter. Preferably, the circular area is spaced by a distance of more than 10 µm from the stripe-like waveguide structure.

Preferably, in each of the first type and the second type of laser device chips, the main surface of the substrate is a rectangle having two sides parallel to and the other two sides perpendicular to the stripe-like waveguide structure, and each of the other two sides has a length of more than 50 µm and less than 250 µm.

It is desirable that, in each of the first type and the second type of laser device chips, an area not having the electrode pad for the second conductivity type on an upper surface of the semiconductor layer of the second conductivity type is lower in reflectance by more than 10% with respect to almost the entire wavelength range of incident illumination light vertical to the chip as compared to the other area having the electrode pad for the second conductivity type during the automatic image recognition.

For that purpose, it is preferable that the area not having the electrode pad for the second conductivity type on the upper surface of the semiconductor layer of the second conductivity type has a layer of more than 10 nm thickness made of an absorbing material having an absorption coefficient of more than $10000\,cm^{-1}$ with respect to almost the entire wavelength range of incident illumination light vertical to the chip during the automatic image recognition. Preferably, the absorbing material is insulator or semiconductor, and can include silicon, germanium, or $TiO_2$.

Instead of having such a light absorbing layer, the area not having the electrode pad for the second conductivity type on the upper surface of the semiconductor layer of the second conductivity type may have minute surface unevenness, and a root mean square roughness over a length of 5 µm in a direction parallel to the uneven surface is preferably more than 1 nm and less than 200 nm.

A nitride semiconductor laser device according to the present invention includes a nitride semiconductor layer of a first conductivity type, an active layer of a nitride semiconductor, a nitride semiconductor layer of a second conductivity type, and an electrode pad for the second conductivity type stacked in this order on a main surface of a conductive substrate, wherein a stripe-like waveguide structure parallel to the active layer is formed, and an area of the electrode pad for the second conductivity type is more than 2% and less than 90% of an area of the main surface of the substrate.

In an area not having the electrode pad for the second conductivity type on an upper surface of the semiconductor layer of the second conductivity type, a metal layer of less than 0.1 µm thickness may be formed, or may be omitted.

Preferably, the electrode pad for the second conductivity type includes a circular area of 80 µm diameter, and the circular area is spaced by a distance of more than 10 µm from the stripe-like waveguide structure.

Preferably, the main surface of the substrate is a rectangle having two sides parallel to and the other two sides perpendicular to the stripe-like waveguide structure, and each of the other two sides has a length of more than 50 µm and less than 250 µm.

It is desirable that an area not having the electrode pad for the second conductivity type on an upper surface of the semiconductor layer of the second conductivity type is lower by more than 10% in reflectance with respect to almost the entire wavelength range of incident illumination light vertical to the chip as compared to the other area having the electrode pad for the second conductivity type during the automatic image recognition.

For that purpose, it is preferable that the area not having the electrode pad for the second conductivity type on the upper surface of the semiconductor layer of the second conductivity type has a layer of more than 10 nm thickness made of an absorbing material having an absorption coefficient of more than $10000\,cm^{-1}$ with respect to almost the entire wavelength range of incident illumination light vertical to the chip during the automatic image recognition. Preferably, the absorbing material is insulator or semiconductor, and can include silicon, germanium, or $TiO_2$.

Instead of having such a light absorbing layer, the area not having the electrode pad for the second conductivity type on the upper surface of the semiconductor layer of the second conductivity type may have minute surface unevenness, and a root mean square roughness over a length of 5 µm in a direction parallel to the uneven surface is preferably more than 1 nm and less than 200 nm.

The nitride semiconductor laser device according to the present invention can preferably be included as a light source in an optical information reproducing apparatus.

The foregoing and other objects, features, aspects and advantages of the present invention will become more apparent from the following detailed description of the present invention when taken in conjunction with the accompanying drawings.

DETAILED DESCRIPTION

First Embodiment

Figure 1:
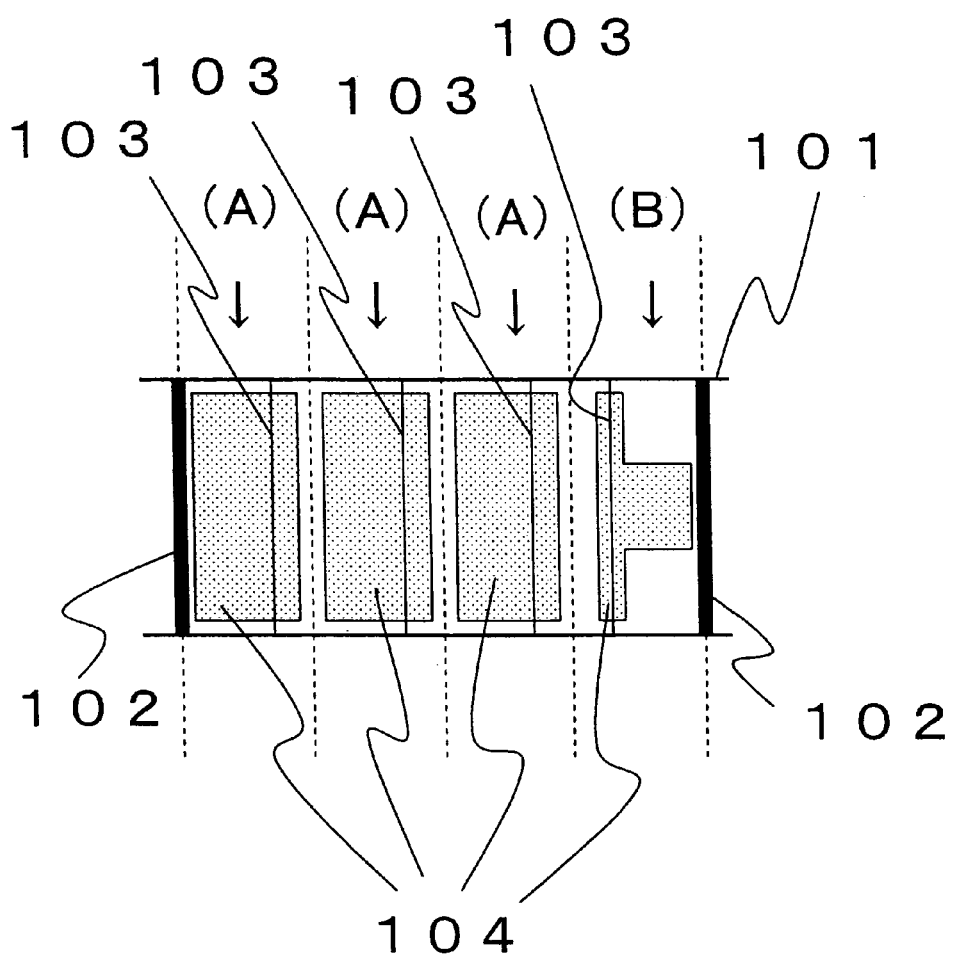
FIG. 1 is a schematic plan view showing nitride semiconductor laser devices in a state of a laser bar in accordance with an embodiment of the present invention.

FIG. 1 is a schematic plan view showing nitride semiconductor laser devices in a state of a laser bar according to a first embodiment of the present invention. In a laser bar 101 of this drawing, there are formed a plurality of trenched regions 102. Between trenched regions 102, a plurality of ridge-like stripes 103 are formed, and a plurality of p-side electrode pads 104 are formed to cover ridge-like stripes 103. Every dotted line in FIG. 1 indicates a chip division plane.

In the first embodiment, an area ratio of p-side electrode pad 104 to the upper surface area (hereinafter referred to as a chip area) of a nitride semiconductor laser device (B) is less than 90% differently from that of a nitride semiconductor laser device (A).

In an automatic chip inspection apparatus that uses an automatic image recognition process, it is preset to determine whether a chip is acceptable or not based on the shape of p-side electrode pad 104 and preset to determine nitride semiconductor laser device (A) as acceptable, for example. When the nitride semiconductor laser devices of the first embodiment are introduced into the automatic chip inspection apparatus, only chips (A) are extracted for chip inspection, and chips (B) are determined as having an unacceptable shape and left in a chip supplying area without being inspected. Therefore, it is possible to eliminate a problem that all of the laser devices are subjected to chip inspection and rather many of them are determined as defective in the case of chip inspection for the conventional nitride semiconductor laser devices.

Figure 2:
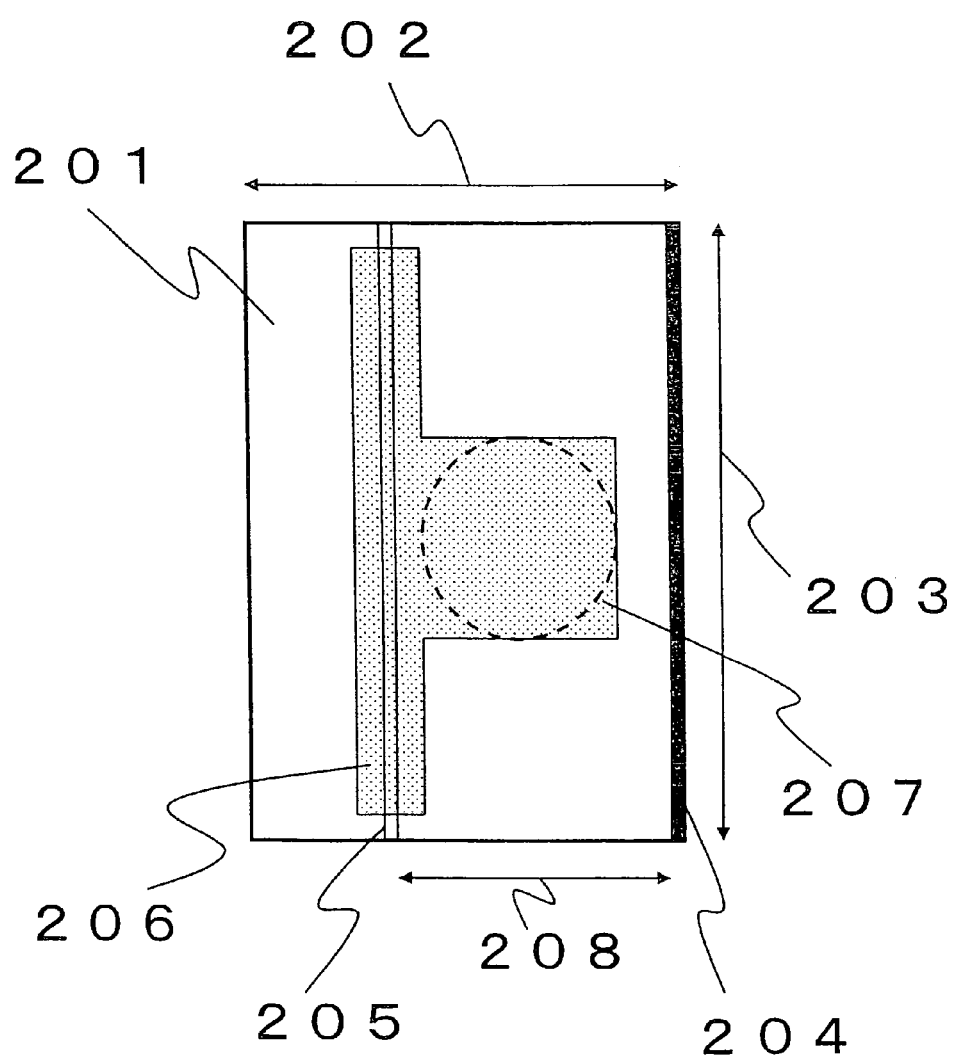
FIG. 2 is a schematic plan view illustrating a shape of a p-side electrode pad of a chip (B) in FIG. 1 in more detail.

FIG. 2 is a schematic plan view illustrating a shape of the p-side electrode pad of chip (B) in more detail. In this drawing, a nitride semiconductor laser device 201 is set to have a chip width 202 of 50 to 250 µm (e.g., 200 µm) and a length 203 (corresponding to a resonator length) of 300 to 1500 µm (e.g., 600 µm). A trenched region 204 of a worked substrate exists along the right side of laser device 201. A ridge-like stripe 205 is formed at a position spaced by a distance 208 of 120 µm from the right side.

A p-side electrode pad 206 includes a first area covering ridge-like stripe 205 and a second area for wire bonding. The first area has a width of 5 to 50 µm (e.g., 20 µm) and a length retracted by 5 to 50 µm (e.g., 20 µm) from each end of the resonator. The second area of electrode pad 206 is formed as an area (e.g., as a square with a side of 80 µm) including a circle 207 of 80 µm diameter.

In chip (B), the area ratio of the p-side electrode pad to the chip area is set to less than 90% of that in chip (A). For example, when the chip has a width of 200 µm and a length of 600 µm, and the p-side electrode pad includes the first area of 20 µm width and 560 µm length and the second area of a square with a side of 80 µm, the chip area is 120000 µm$^2$ and the area of the p-side electrode pad is 17600 µm$^2$. Thus, the area of the p-side electrode pad accounts for about 15% of the chip area.

Figure 3:
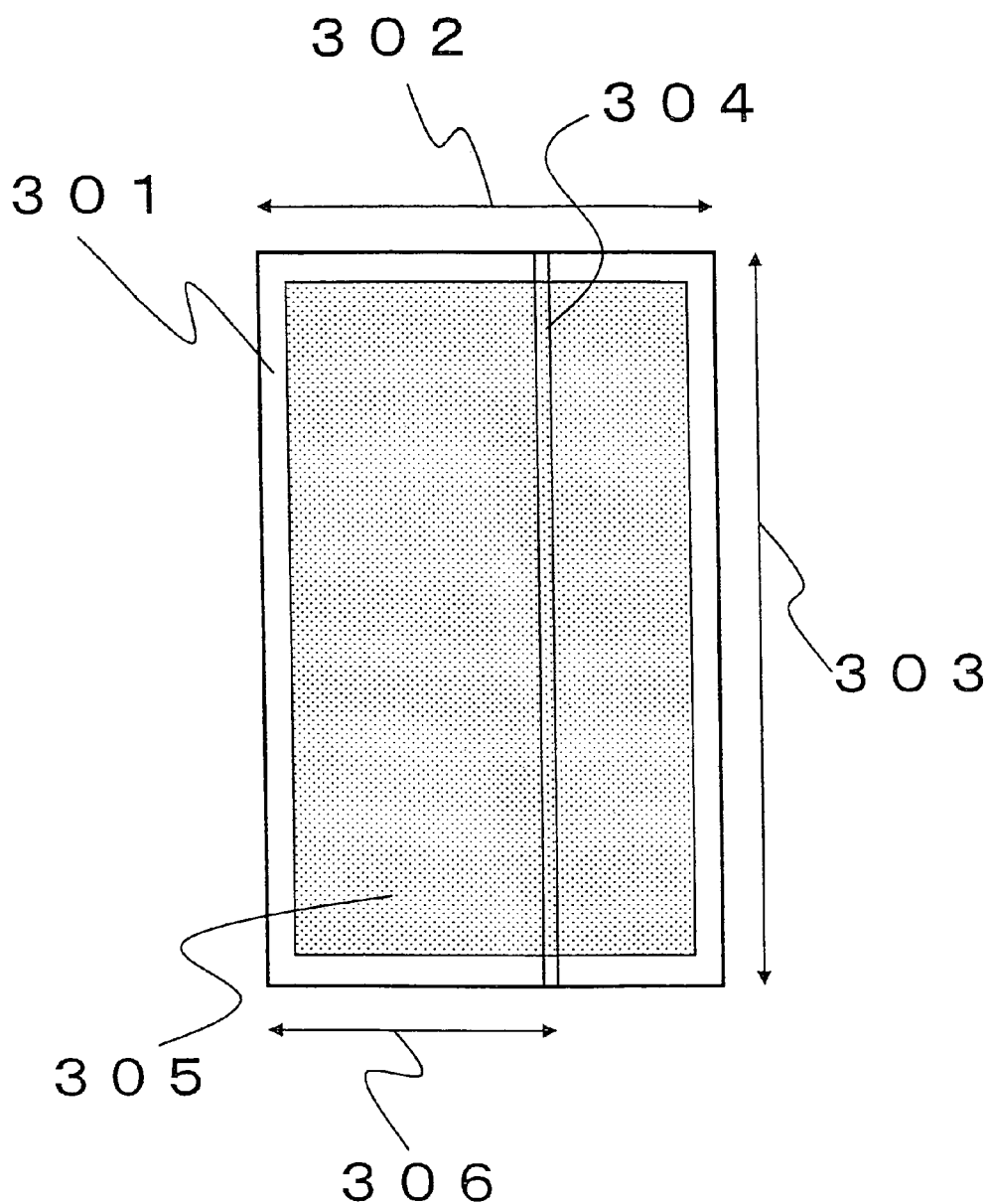
FIG. 3 is a schematic plan view illustrating a shape of a p-side electrode pad of a chip (A) in FIG. 1 in more detail.

FIG. 3 is a schematic plan view illustrating a shape of the p-side electrode pad of chip (A) in more detail. In this drawing, a nitride semiconductor laser device 301 is set to have a chip width 302 of 50 to 250 µm (e.g. 200 µm) and a length 303 of 300 to 1500 µm (e.g., 600 µm). A ridge-like stripe 304 is formed at a position spaced by a distance 306 of 120 µm from the left side of the chip. A p-side electrode pad 305 is formed being retracted by a distance of 10 to 50 µM (e.g., 20 µm) from the chip division planes and the resonator end faces. For example, when the chip has a width of 200 µm and a length of 600 µm, and the p-side electrode pad is formed to have a width of 160 µm and a length of 560 µm, the chip area is 120000 µm$^2$ and the area of the p-side electrode pad is 89600 µm$^2$. Thus, the area of the p-side electrode pad accounts for about 75% of the chip area.

In the first embodiment, therefore, the area ratio of the p-side electrode pad to the chip area in chip (B) accounts for 20% (=15÷75×100%) of that in chip (A).

Figure 4:
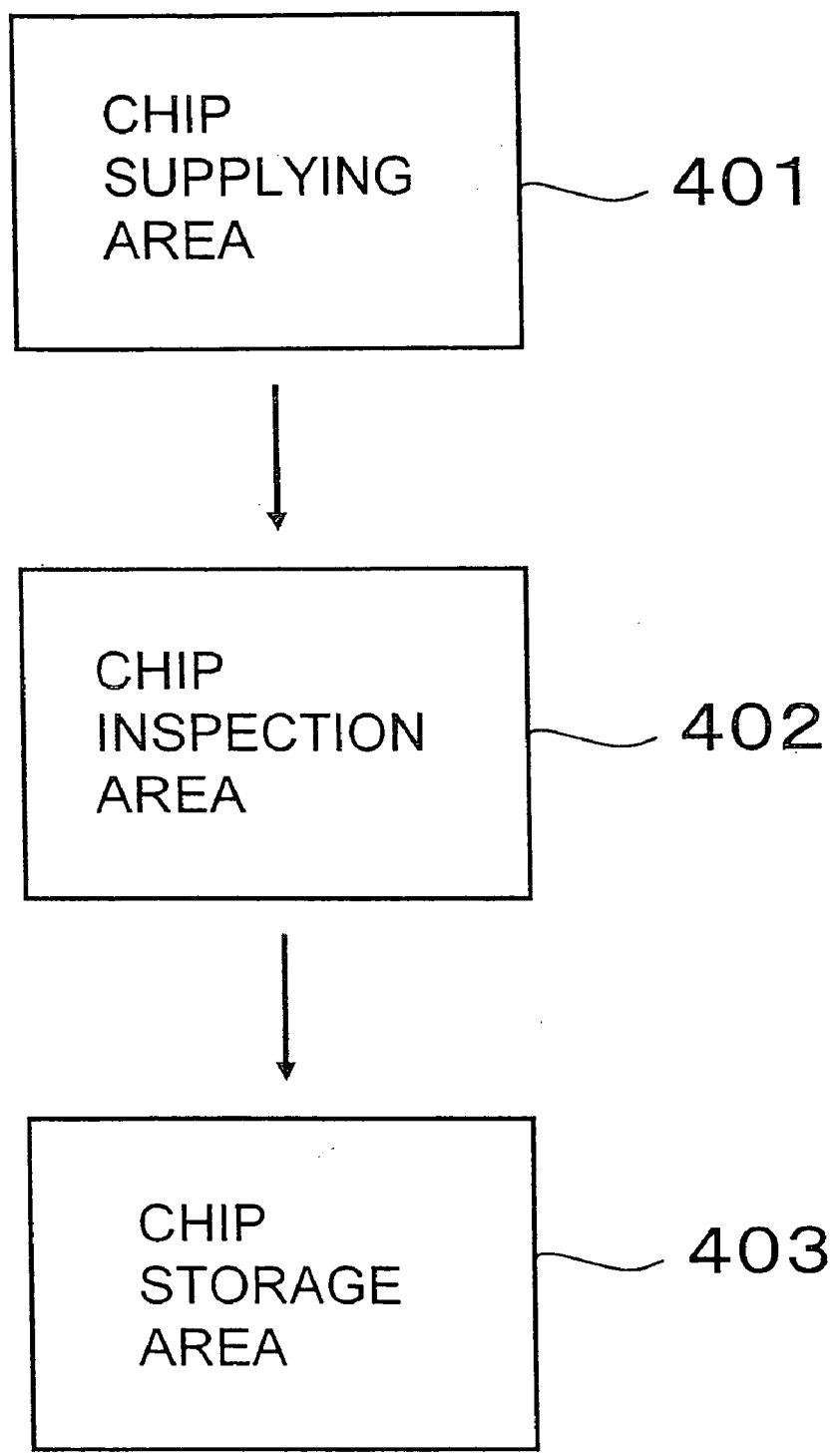
FIG. 4 is a conceptual block diagram showing a general constitution of an automatic chip inspection apparatus.

FIG. 4 is a conceptual block diagram showing a general constitution of an automatic chip inspection apparatus. A chip to be introduced into the automatic chip inspection apparatus is set in a chip supplying area 401. Here, the automatic chip inspection apparatus recognizes the chip by automatic image recognition, confirms its shape and carry out alignment thereof, and then transfers the chip to a chip inspection area 402. After measurement of properties such as I-L and I-V properties of the semiconductor laser in the chip inspection area, the automatic chip inspection apparatus transfers the measured chip to a chip storage area 403.

In the image recognition in chip supplying area 401, an image of a chip is taken from its upper surface with a camera, and the shape of the p-side electrode pad of the laser device can be recognized based on brightness distribution in the image. When a recognized size of the p-side electrode pad is compared with a size of a recognition image input beforehand into the automatic chip inspection apparatus and matches the size of the recognition image within a tolerance input beforehand, the chip is transferred to the subsequent chip inspection area. On the other hand, if the recognized size of the p-side electrode pad falls out of the tolerance, the chip is determined as unacceptable and disregarded, and the automatic chip inspection apparatus shifts to image recognition for a subsequent chip.

If the tolerance is set for example to 30% on this occasion, all of chips (A) can be transported to chip inspection area 402. However, chip (B) is determined as unacceptable because the area of its p-side electrode pad falls out of the tolerance, differently from chip (A). Therefore, chip (B) is left in chip supplying area 401 without being transported to chip inspection area 402. Consequently, chips (B) left in chip supplying area 401 can be handled after chips (A) set in chip supplying area 401 are all inspected and transferred to chip storage area 403. That is, chip (A) and chip (B) can readily be separated based on the shapes of their p-side electrode pads.

As described above, since chip (A) and chip (B) can be separated and inspected by the automatic chip inspection apparatus, it is possible to set inspection conditions optimized for each position of their ridge-like stripes. Further, since chip (A) and chip (B) can be separately introduced into an automatic mounting apparatus, it is possible to set process conditions optimized for each position of their light-emitting points.

In order to separate both the types of chips in a more stable manner, it is preferable to set the area ratio of the p-side electrode pad to the chip area in chip (B) to a value obtained by subtracting a tolerance from the area ratio in chip (A) or further subtracting more than 5% (preferably more than 10%). For example, when the area ratio of the p-side electrode pad to the chip area in chip (A) is 100% and the aforementioned tolerance is 0%, both the types of chips can be separated in a stable manner if the area ratio of the p-side electrode pad to the chip area in chip (B) is set to 90%. In other words, in order to obtain the effect of the present invention, the upper limit of the area ratio of the p-side electrode pad to the chip area is calculated as 90%, based on the above calculation.

In order to separate both the types of chips in a more stable manner, however, the tolerance is preferably set to about ±1% to 50%, more preferably at 10% to 40%. This is because, even when chips are fabricated with the same design, some chips are liable to be determined as unacceptable due to contamination on the chip, peeling of the p-side electrode pad caused during the process, or scratches on the chip, even if these defects cause no problems in the properties of the laser device. Consequently, when the aforementioned tolerance is set to 30% for example, the area ratio of the p-side electrode pad to the chip area in chip (B) is desirably set to less than 60% and preferably less than 40% of the area ratio in chip (A).

Figure 8:
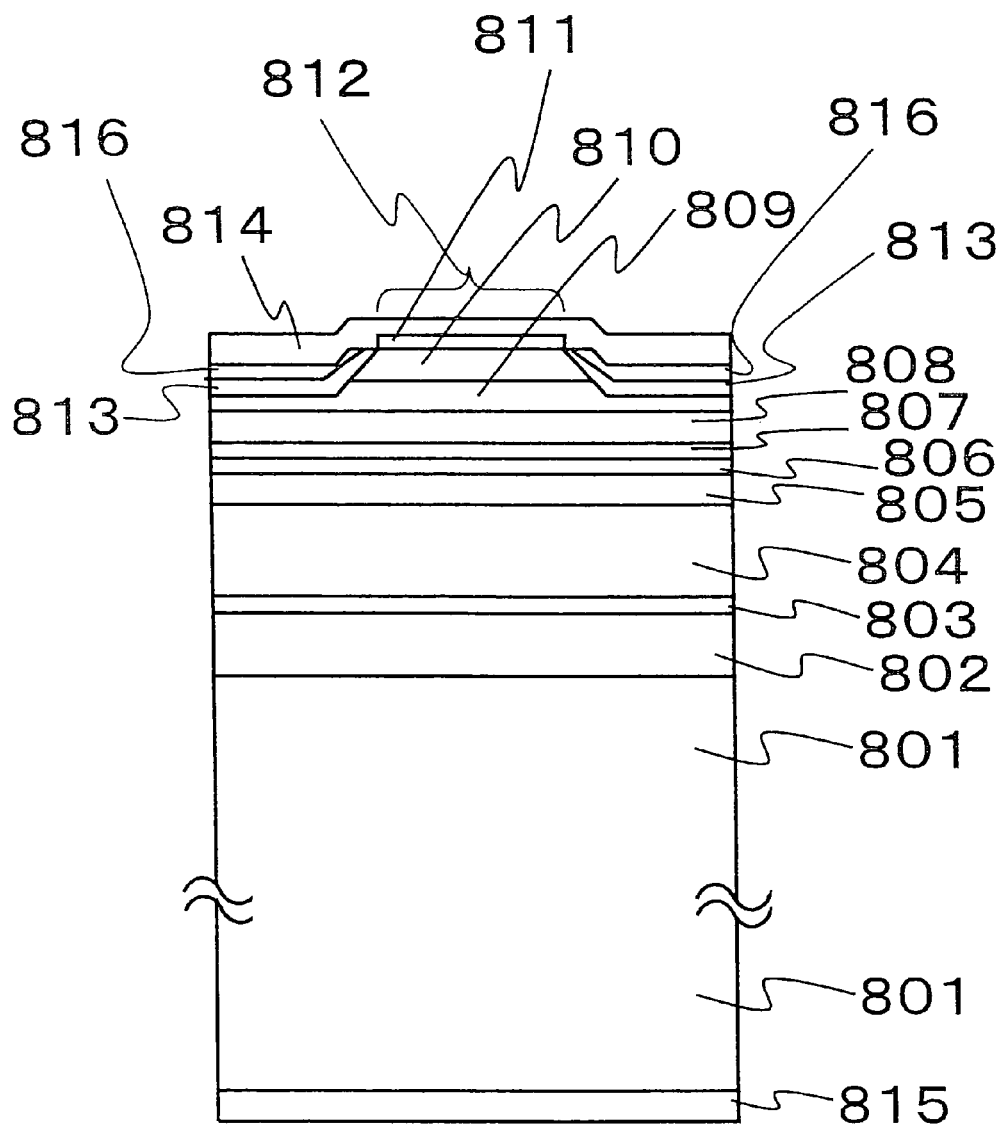
FIG. 8 is a schematic cross-sectional view showing a main part of a layered structure in the nitride semiconductor laser device shown in FIG. 1.
Figure 9:
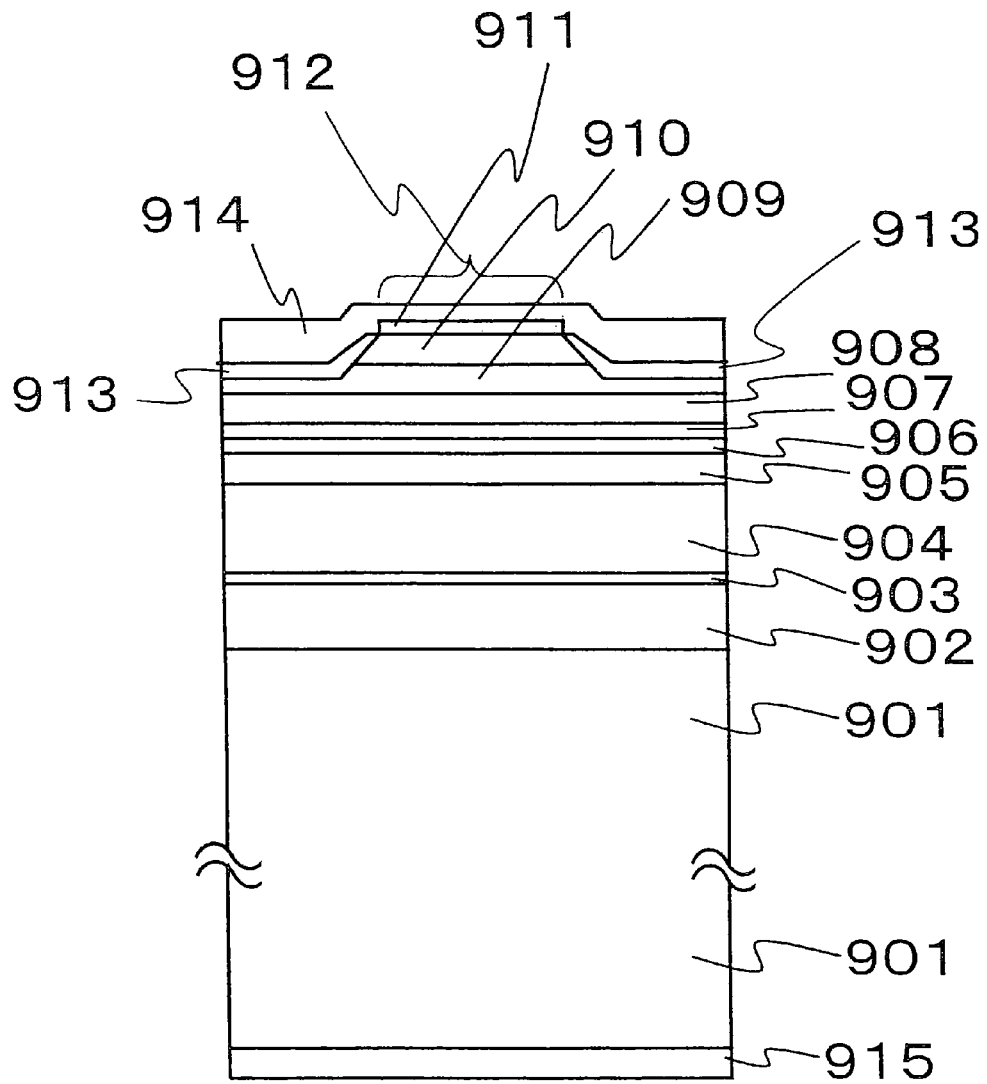
FIG. 9 is a schematic cross-sectional view exemplarily showing a main part of a conventional nitride semiconductor laser device.
Figure 10:
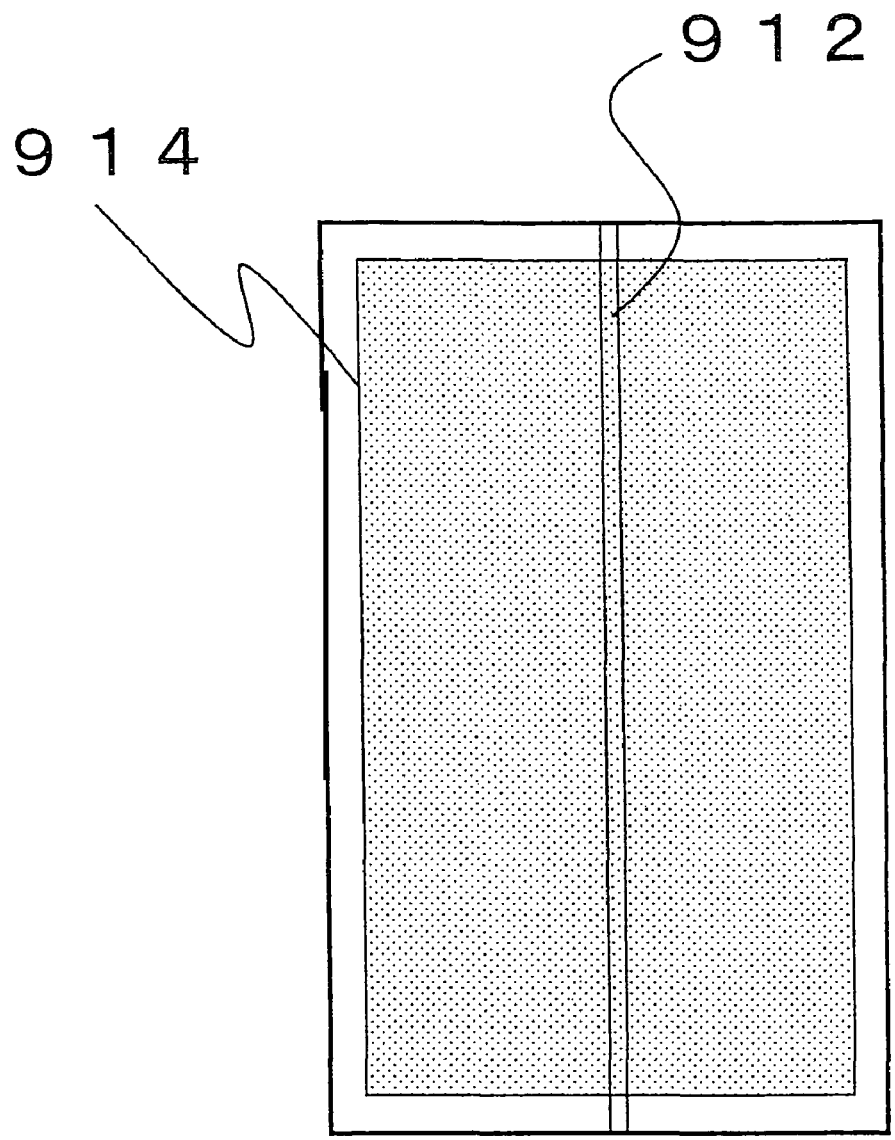
FIG. 10 is a schematic plan view of the nitride semiconductor laser device of FIG. 9 seen from above.
Figure 11:
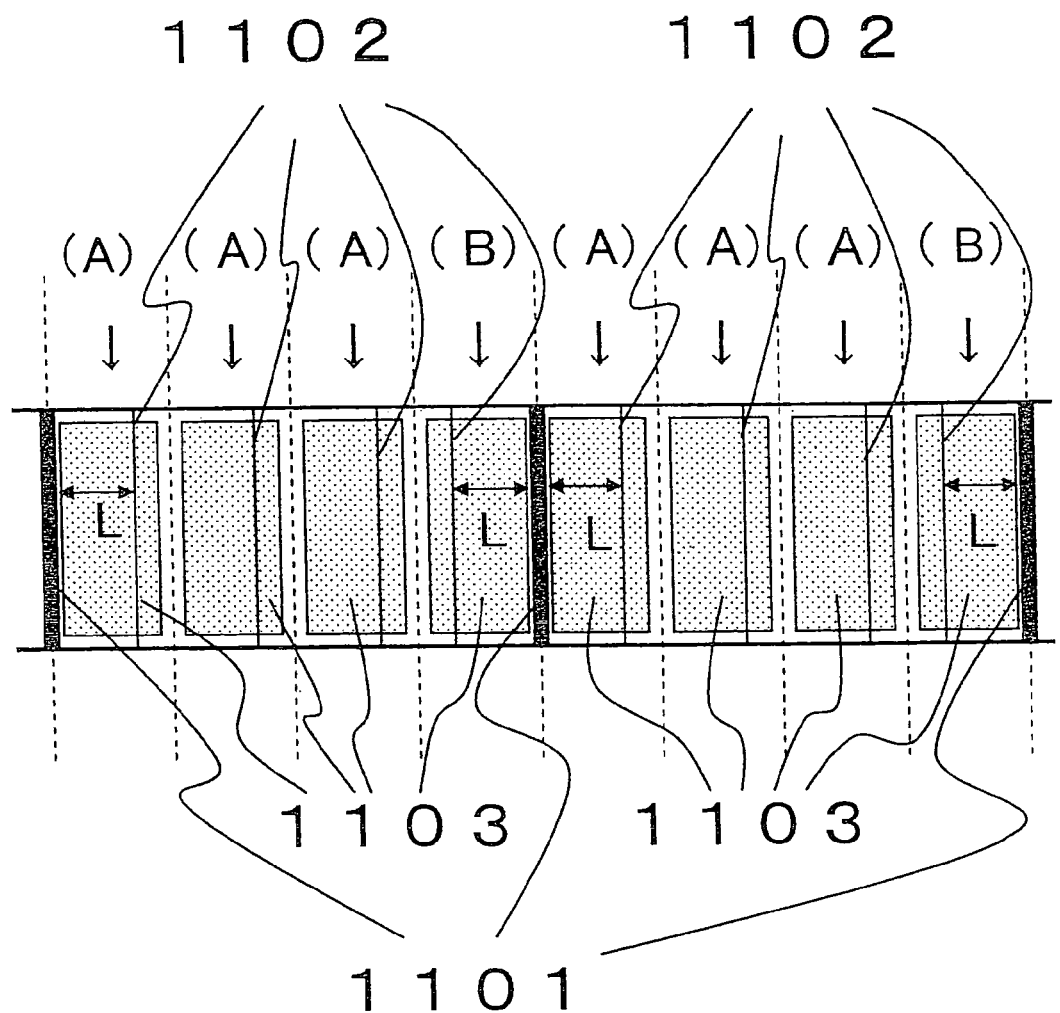
FIG. 11 is a schematic plan view exemplarily showing an upper surface of a laser bar according to the prior art just before division into individual chips.

FIG. 8 is a schematic cross-sectional view showing a main part of a layered structure in the nitride semiconductor laser device of the first embodiment. This laser device includes an n-type GaN layer (thickness: 3 μm) 802; an n-type $In_{0.05}Ga_{0.95}N$ buffer layer 803; an n-type $Al_{0.05}Ga_{0.95}N$ clad layer 804 (thickness: 2.0 μm); an n-type GaN optical waveguide layer 805 (thickness: 0.1 μm); an $In_{0.2}Ga_{0.8}N$/n-type $In_{0.05}Ga_{0.95}N$ (respective thicknesses: 4 nm/8 nm) triple-quantum-well (3MQW) active layer 806; a p-type $Al_{0.2}Ga_{0.8}N$ carrier stop layer 807 (thickness: 20 nm); a p-type GaN optical waveguide layer 808 (thickness: 0.1 μm); a p-type $Al_{0.05}Ga_{0.95}N$ clad layer 809 (thickness: 0.5 μm); and a p-type GaN contact layer 810 (thickness: 0.2 μm) stacked in this order on an n-type GaN substrate 801.

A ridge-like stripe 812 of 2 μm width is formed by partially etching p-type GaN contact layer 810 through to a partial depth of p-type AlGaN clad layer 809. The laser device includes an optical confinement waveguide structure in which active layer 806 and optical waveguide layers 805 and 808 are sandwiched between clad layers 804 and 809, and light generated in the active layer is confined in this waveguide structure and causes lasing. It should be noted that FIG. 8 does not show the entire width of the laser device chip but only a part thereof in the vicinity of the ridge-like stripe.

A p-side contact electrode 811 is formed on p-type GaN contact layer 810 left after the partial etching, while an insulating film 813 and a metal layer 816 of less than 0.1 μm thickness are formed on the partially etched areas. A p-side electrode pad 814 is formed to cover p-side contact electrode 811. In the first embodiment, metal layer 816 is formed to improve adhesiveness between insulating film 813 and p-side electrode pad 814; by preferably using Mo or the like, though there arises no problem in laser device properties even if it is omitted.

On the other hand, an n-side electrode 815 is formed on a rear surface of substrate 801. The laser device of FIG. 8 is obtained by dividing a wafer including a large number of device structures into chips. To facilitate the chip division, therefore, substrate 801 is polished to have a thickness of 50 to 200 μm before n-side electrode 815 is formed thereon. Then, the wafer is divided into chips to obtain the nitride semiconductor laser device of FIG. 8 with a width of 300 to 400 μm.

As described above, it is necessary in the present invention to recognize the shape of the p-side electrode pad in the nitride semiconductor laser device by automatic image recognition. On the upper surface of the chip, therefore, as compared to the area having the p-side electrode pad, the other remaining area should have a lower reflectance with respect to almost the entire wavelength range of incident illumination light vertical to the chip during the automatic image recognition. Here, if metal layer 816 has a thickness of more than 0.1 μm, there is only a small difference in reflectance between the area having p-side electrode pad 814 and the other remaining area. In contrast, if metal layer 816 has a thickness of less than 0.1 μm, the normal incident light transmits through metal layer 816, and thus it is possible to cause a difference in reflectance between the area having p-side electrode pad 814 and the other remaining area. That is, although the effect of the present invention can be obtained even without metal layer 816, if metal layer 816 is provided to improve adhesiveness of p-side electrode pad 814 to insulating film 813, it is desirable that metal layer 816 has a thickness of less than 0.1 μm.

Since the problems to be solved by the present invention are caused when the chip has a relatively narrow width such as 50 to 250 μm as described above, the present invention is particularly effective when there is a need to reduce the chip width. Although the ridge-like stripe is formed at a position 120 μm away from the right or left side of the chip in the first embodiment, it should be noted that it may be formed at another position as long as it is spaced from the trenched region of the substrate by more than 90 μm, preferably by more than 110 μm. Further, although the chip division plane is provided along the trenched region in the first embodiment, this is not necessary.

Second Embodiment

Figure 5:
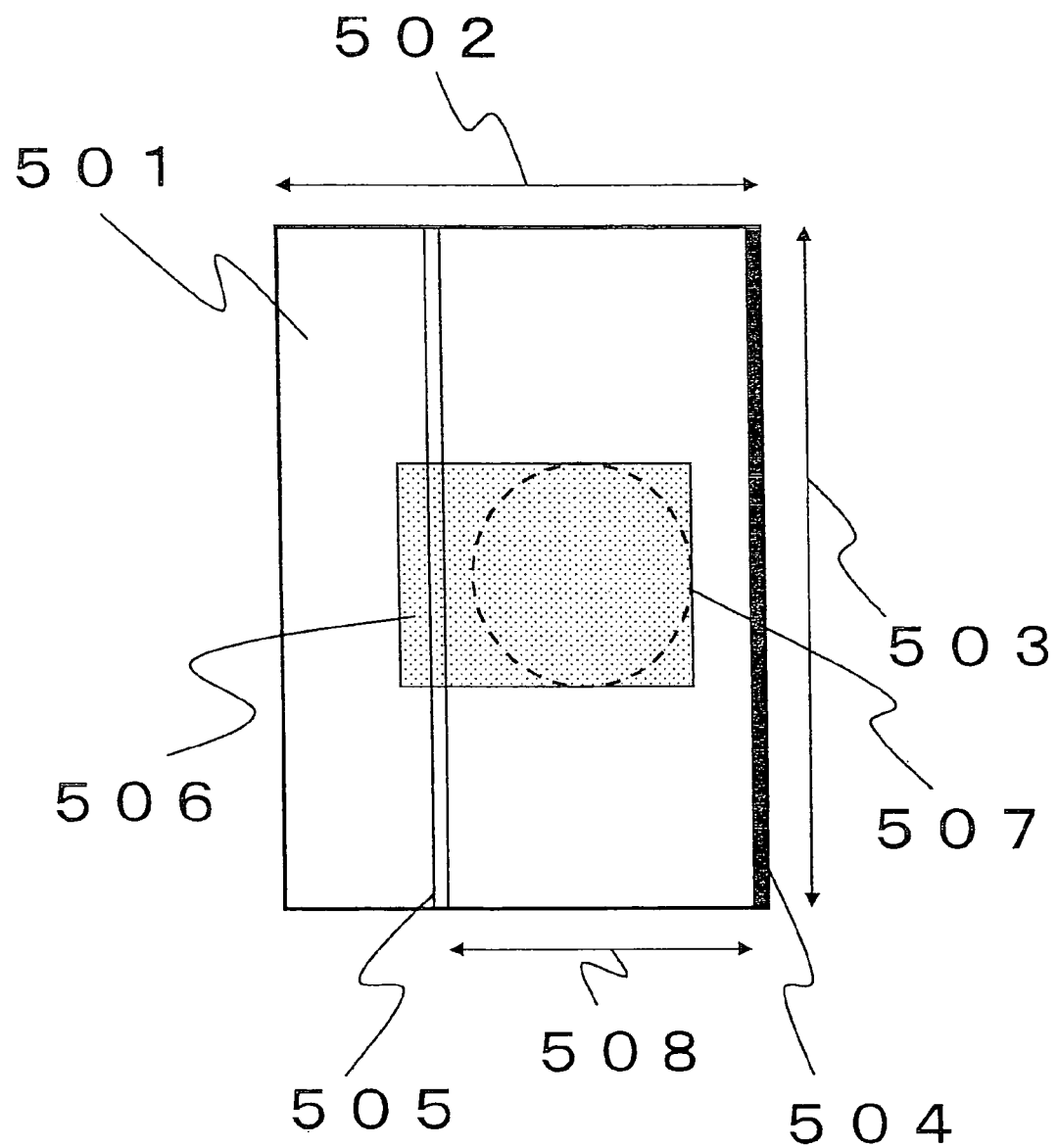
FIG. 5 is a schematic plan view illustrating a shape of a p-side electrode pad of a chip regarding a nitride semiconductor laser device according to another embodiment of the present invention.

FIG. 5 is a schematic plan view illustrating a shape of a p-side electrode pad of a chip (B) as a nitride semiconductor laser device according to a second embodiment of the present invention. In this drawing, a nitride semiconductor laser device 501 is set to have a width 502 of 50 to 250 μm (e.g., 200 μm) and a length (corresponding to a resonator length) 503 of 300 to 1500 μm (e.g., 600 μm). A trenched region 504 of a worked substrate exists along the right side of chip 501. A ridge-like stripe 505 is formed at a position spaced by a distance 508 of 120 μm from the right side of the chip. A p-side electrode pad 506 is formed to include its partial area placed to cover ridge-like stripe 505 and another partial area (e.g., a square with a side of 80 μm) including a circle 507 of 80 μm diameter for wire bonding. P-side electrode pad 506 is formed with its area falling in a range of more than 2% and less than 90% of the chip area.

Circular area 507 for wire bonding is placed preferably more than 5 μm and more preferably more than 10 μm (e.g., 20 μm) away from ridge-like stripe 505. This structure can eliminate a risk that ultrasonic power applied during the wire bonding may reach a semiconductor part near the ridge-like stripe and cause defects such as cracks.

In the second embodiment, for example, when chip 501 has a width of 250 μm and a length of 1500 μm, and p-side electrode pad 506 includes its partial area with a width extending by 20 μm to each of the right and left sides from the center of ridge-like stripe 505 and its another partial area of a square with a side of 80 μm including circle 207 of 80 μm diameter for wire bonding, the chip area is 375000 μm$^2$ and the area of the p-side electrode pad is 9600 μm$^2$. Thus, the area of the p-side electrode pad accounts for about 2.5% of the chip area. In order to obtain the effect of the present invention, the lower limit of the area ratio of the p-side electrode pad to the chip area is 2.5% as calculated by the above calculation.

Third Embodiment

Figure 6:
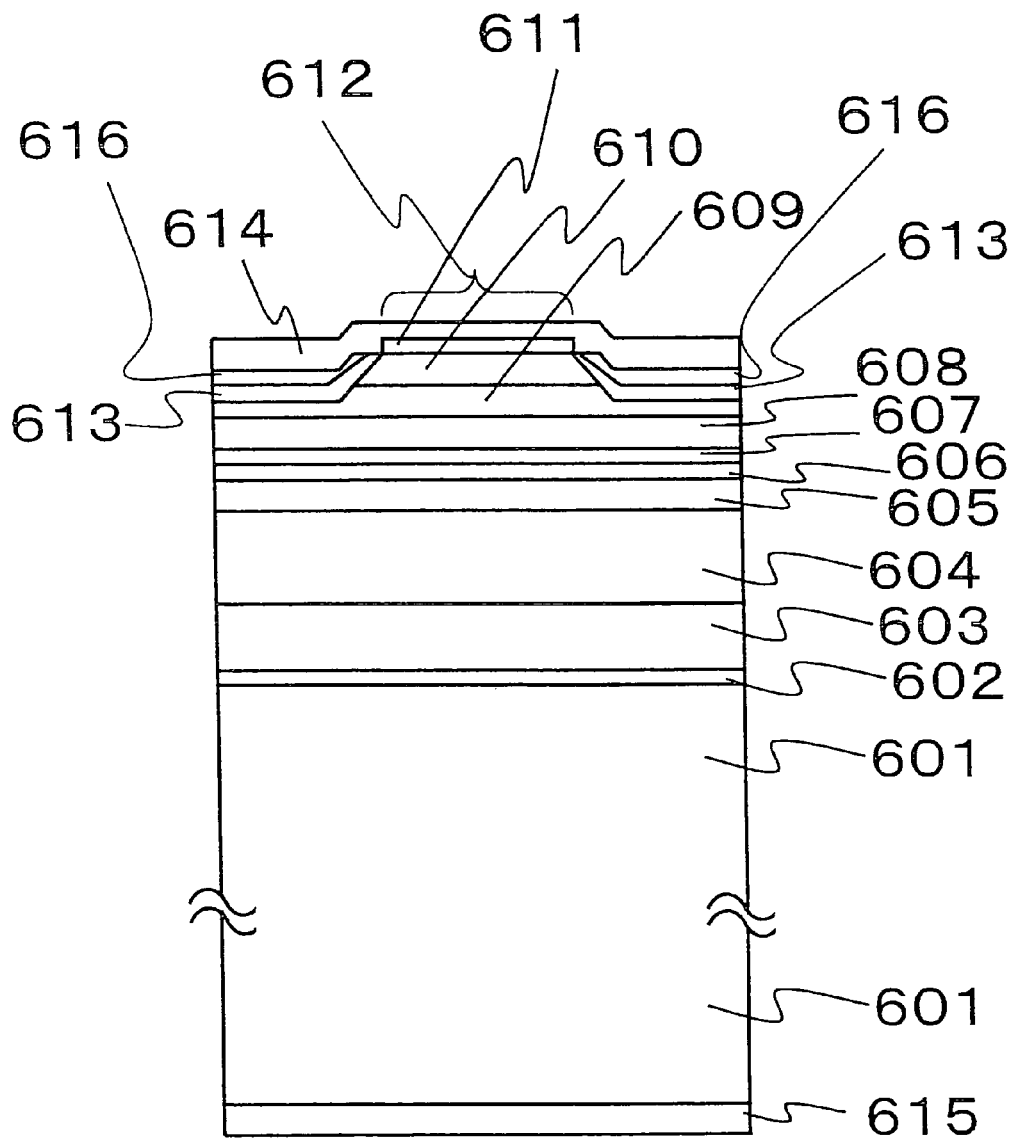
FIG. 6 is a schematic cross-sectional view showing a main part of a layered structure in a nitride semiconductor laser device according to still another embodiment of the present invention.

FIG. 6 is a schematic cross-sectional view showing a main part of a layered structure in a nitride semiconductor laser device according to a third embodiment of the present invention. The cross-sectional structure of FIG. 6 is different from that of FIG. 8 only in that metal layer 816 of less than 0.1 μm thickness is replaced by a layer 616 of a light absorbing material of more than 10 nm thickness. That is, other layers 601 to 615 in FIG. 6 correspond to layers 801 to 815 in FIG. 8, respectively. Further, the p-side electrode pad in the nitride semiconductor laser device of the third embodiment can have a shape identical to that of the first or second embodiment.

Since light absorbing layer 616 is formed on insulating film 613 in the nitride semiconductor laser device of the third embodiment, an area having p-side electrode pad 614 has a higher reflectance with respect to visible light, as compared to the other remaining area not having p-side electrode pad 614. Owing to this, when image recognition is carried out in the automatic chip inspection apparatus, the high contrast between the p-side electrode pad and the other part makes it possible to obtain an effect that recognition errors during the image recognition can sufficiently be prevented.

To make this effect significant, it is desirable during the automatic image recognition that, as compared to the area having the p-side electrode pad, the area not having the p-side electrode pad is lower by more than 10% (preferably, by more than 20%) in reflectance with respect to almost the entire wavelength range of incident illumination light vertical to the chip. This is achieved if light absorbing layer 616 has an absorption coefficient of more than 10000 cm$^{-1}$. As a material satisfying this condition, Si, Ge, TiO$_2$, or the like can be used for example. Desirably, light absorbing layer 616 also serves as an insulating layer, and for this purpose, light absorbing layer 616 is preferably an insulator such as TiO$_2$ or a semiconductor such as Si or Ge.

Fourth Embodiment

A nitride semiconductor laser device according to a fourth embodiment of the present invention is different from those of the first and second embodiments only in that it has minute surface unevenness on bottom surfaces of areas partially etched and removed to form the ridge-like stripe. With such surface unevenness, as compared to the area having the p-side electrode pad, the area not having the p-side electrode pad can be lower by more than 10% in reflectance with respect to almost the entire wavelength range of incident illumination light vertical to the chip during the automatic image recognition. The minute surface unevenness can realize the above reflectance ratio less by more than 10% when the RMS (root mean square) roughness is more than 1 nm over a length of 5 μm in a direction parallel to the etched bottom surface. The minute surface unevenness can be formed with adjustment of etching conditions as appropriate.

Fifth Embodiment

In a fifth embodiment of the present invention, one of the nitride semiconductor laser devices disclosed in the aforementioned embodiments is used as a light source for reproduction in an optical information reproducing apparatus. The optical information reproducing apparatus can include known components as components other than the light source.

Figure 7:
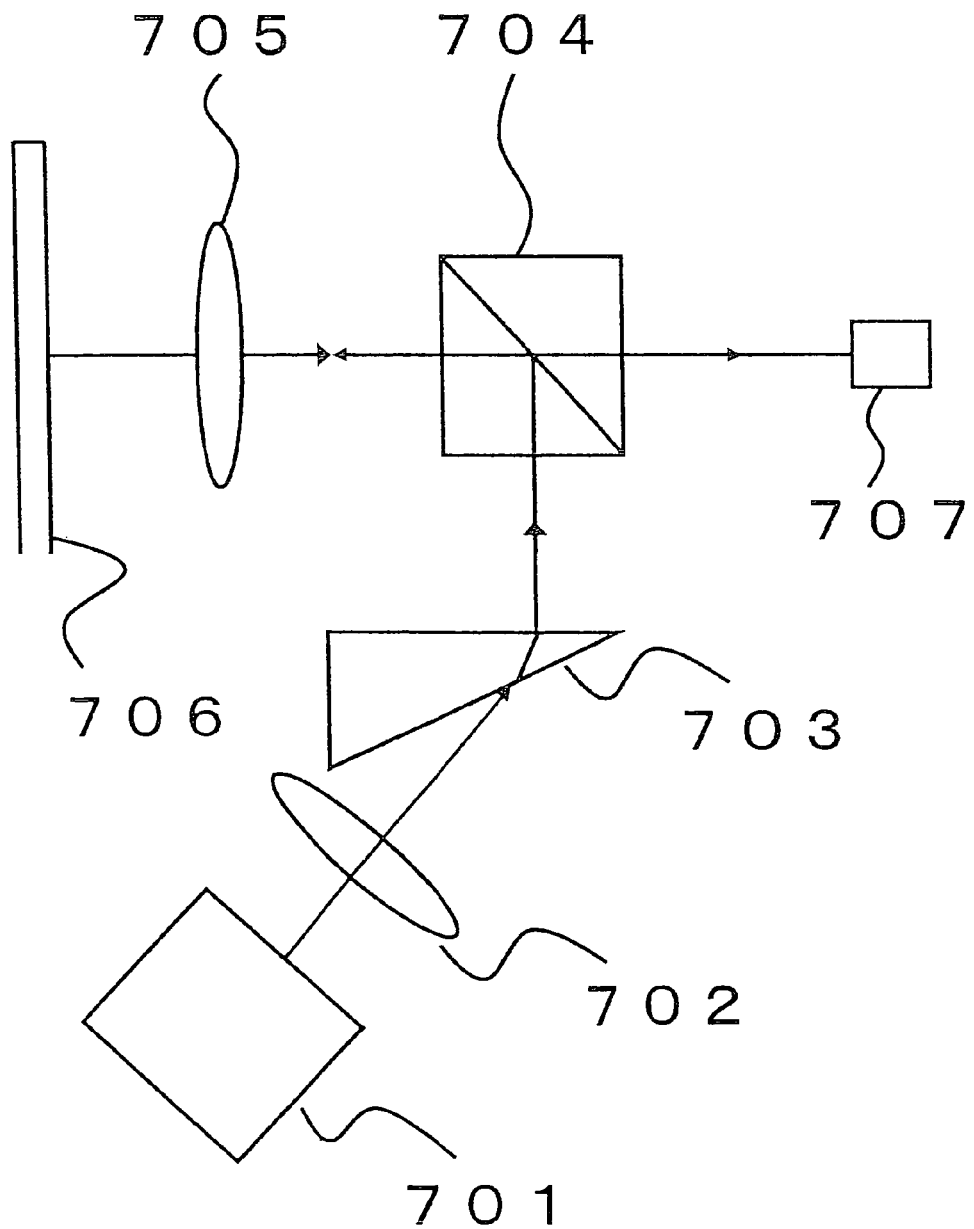
FIG. 7 is a schematic block diagram illustrating an optical system and a propagation path of light for reproduction in an optical information reproducing apparatus according to still another embodiment of the present invention.

FIG. 7 is a schematic block diagram illustrating an optical system and a propagation path of light for reproduction in an optical information reproducing apparatus according to the fifth embodiment of the present invention. This optical information reproducing apparatus includes a nitride semiconductor laser device 701 of the present invention, beam emission control means (not shown), a collimator lens 702, a beam shaping prism 703, a beam splitter 704, an objective lens (focusing means) 705, an optical disk (optical recording medium) 706, focus position control means (not shown), and a light detecting system (light detecting means) 707 for detecting light. For clarity and simplicity of the drawing, components (means) not important for illustrating the features of the present invention are omitted in FIG. 7. Needless to say, on the other hand, optical disk (optical recording medium) 706 shown in FIG. 7 is not specific to the optical information reproducing apparatus and is accepted when information is recorded or reproduced.

In the optical information reproducing apparatus of the fifth embodiment, nitride semiconductor laser device 701 can serve as a light source for both recording and reproduction. In recording operation and erasing operation, laser light emitted from nitride semiconductor laser device 701 is converted to parallel light or nearly parallel light by collimator lens 702, passes through beam splitter 704, and is focused by objective lens 705 onto an information recording surface of optical disk 706. Then, bit-information is written on the recording surface of optical disk 706 by magnetic modulation or refractive index modulation. In reproducing operation, laser light emitted from nitride semiconductor laser device 701 is focused onto the record surface of optical disk 706 recorded by unevenness, magnetic modulation, or refractive index modulation. The focused laser light is reflected by the information record surface, passes through objective lens 705 and beam splitter 704, and then enters light detecting system 707 in which an optically detected signal is converted to an electrical signal to read recorded information.

Since the optical information reproducing apparatus of the fifth embodiment uses a nitride semiconductor laser device that is inexpensive and has a small chip width in a range of 50 to 250 μm, its production cost can be suppressed.

As has been described, the present invention can provide a nitride semiconductor laser device of a small width at a low cost, and also contribute to cost reduction of an optical information reproducing apparatus by using the laser device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a nitride semiconductor laser device, comprising:
    forming a wafer including a nitride semiconductor layer of a first conductivity type, an active layer of a nitride semiconductor, a nitride semiconductor layer of a second conductivity type, and an electrode pad layer for the second conductivity type stacked in this order on a main surface of a conductive substrate, said wafer also including a plurality of stripe-like waveguide structures parallel to said active layer;
    forming first and second nitride semiconductor laser devices on said wafer by patterning the electrode pad layer to form a plurality of electrode pads;
    cutting said wafer to obtain individual first and second nitride semiconductor laser device chips, each of the first and second nitride semiconductor laser device chips including an electrode pad of the plurality of electrode pads and a stripe-like waveguide structure of the plurality of stripe-like waveguide structures; and
    distinguishing between said first and second nitride semiconductor laser device chips by automatic image recognition,
    wherein said first and second nitride semiconductor laser device chips differ from each other and are distinguished based on positions of said plurality of stripe-like waveguide structures with respect to a width direction of each of said first and second nitride semiconductor laser device chips and as to an area ratio of said electrode pad for the second conductivity type to said main surface of said conductive substrate for each of the first and second nitride semiconductor laser device chips.

2. The method of producing a nitride semiconductor laser device according to claim 1, wherein the area ratio of said electrode pad for the second conductivity type in said first nitride semiconductor laser device chip is less than 60% of the area ratio of said electrode pad for the second conductivity type in said second nitride semiconductor laser device chip.

3. The method of producing a nitride semiconductor laser device according to claim 1, further comprising:
    a metal layer of less than 0.1 μm thickness on an upper surface of said nitride semiconductor layer of the second conductivity type in an area not having said electrode pad for the second conductivity type in each of said first and second nitride semiconductor laser device chips.

4. The method of producing a nitride semiconductor laser device according to claim 1, wherein said electrode pad for the second conductivity type includes a circular area of 80 μm diameter in each of said first and second nitride semiconductor laser device chips.

5. The method of producing a nitride semiconductor laser device according to claim 4, wherein said circular area is spaced by a distance of more than 10 μm from said stripe-like waveguide structure in each of said first and second nitride semiconductor laser device chips.

6. The method of producing a nitride semiconductor laser device according to claim 1, wherein said main surface of said conductive substrate is a rectangle having two sides parallel to and the other two sides perpendicular to said stripe-like waveguide structure, and each of said other two sides has a length of more than 50 μm and less than 250 μm in each of said first and second nitride semiconductor laser device chips.

7. The method of producing a nitride semiconductor laser device according to claim 1, wherein an area not having said electrode pad for the second conductivity type on an upper surface of said nitride semiconductor layer of the second conductivity type in each of said first and second nitride semiconductor laser device chips is lower by more than 10% in reflectance with respect to almost the entire wavelength range of incident illumination light vertical to said first and second nitride semiconductor laser device chips compared to an area having said electrode pad for the second conductivity type during said automatic image recognition.

8. The method of producing a nitride semiconductor laser device according to claim 7, wherein the area not having said electrode pad for the second conductivity type on the upper surface of said nitride semiconductor layer of the second conductivity type has a layer of more than 10 nm thickness made of an absorbing material having an absorption coefficient of more than 10000 cm$^{-1}$ with respect to almost the entire wavelength range of incident illumination light vertical to said first and second nitride semiconductor laser device chips during said automatic image recognition.

9. The method of producing a nitride semiconductor laser device according to claim 7, wherein the area not having said electrode pad for the second conductivity type on the upper surface of said nitride semiconductor layer of the second conductivity type has minute surface unevenness, and a root mean square roughness over a length of 5 μm in a direction parallel to the uneven surface is more than 1 nm and less than 200 nm in each of said first and second nitride semiconductor laser device chips.

10. The method of producing a nitride semiconductor laser device according to claim 8, wherein said absorbing material is an insulator or a semiconductor.

11. The method of producing a nitride semiconductor laser device according to claim 8, wherein said absorbing material includes silicon, germanium, or $TiO_2$.

12. The method of producing a nitride semiconductor laser device according to claim 1, wherein the distinguishing by automatic image recognition is based on the positions of said plurality of stripe-like waveguide structures and the area ratio of said electrode pad.

13. The method of producing a nitride semiconductor laser device according to claim 1, wherein said first and second nitride semiconductor laser device chips are distinguished from each other by the automatic image recognition of said area ratio of said electrode pad for the second conductivity type to said main surface of said conductive substrate.

14. The method of producing a nitride semiconductor laser device according to claim 13, wherein said first nitride semiconductor laser device chips each receive wire-bonding at substantially the same position with respect to their stripe-like waveguide structures; said second nitride semiconductor laser device chips each receive wire-bonding at substantially the same position with respect to their stripe-like waveguide structures; and the wire-bonding position with respect to the stripe-like waveguide structure in said first nitride semiconductor laser device chip is different from the wire-bonding position with respect to the stripe-like waveguide structure in said second nitride semiconductor laser device chip.

* * * * *